United States Patent [19]
Kamimura

[11] Patent Number: 5,357,129
[45] Date of Patent: Oct. 18, 1994

[54] SOLID STATE IMAGING DEVICE HAVING HIGH-SENSITIVITY AND LOW-NOISE CHARACTERISTICS BY REDUCING ELECTROSTATIC CAPACITY OF INTERCONNECTION

[75] Inventor: Shinya Kamimura, Nara, Japan

[73] Assignee: Sharp Kabushiki Kaisha, Osaka, Japan

[21] Appl. No.: 157,725

[22] Filed: Nov. 24, 1993

[30] Foreign Application Priority Data

Dec. 28, 1992 [JP] Japan ................................ 4-347453
Sep. 9, 1993 [JP] Japan ................................ 5-224233

[51] Int. Cl.$^5$ ..................... H01L 29/78; H01L 27/14; H01L 31/00
[52] U.S. Cl. ..................... 257/239; 257/223; 257/230; 257/232; 257/233; 257/241; 377/62
[58] Field of Search ............. 257/223, 230, 232, 233, 257/239, 241; 377/60, 62

[56] References Cited

U.S. PATENT DOCUMENTS

| 4,660,064 | 4/1987 | Hamasaki | 257/239 |
| 5,029,190 | 7/1991 | Narabu et al. | 377/60 |
| 5,202,907 | 4/1993 | Yonemoto | 257/239 |

FOREIGN PATENT DOCUMENTS

| 0503666 | 9/1992 | European Pat. Off. |  |
| 58-125872 | 7/1983 | Japan | 257/239 |
| 60-160659 | 8/1985 | Japan |  |
| 60-223161 | 11/1985 | Japan | 257/239 |
| 1-283870 | 11/1989 | Japan |  |
| 4-207043 | 7/1992 | Japan |  |
| 0506317 | 3/1993 | Japan |  |

*Primary Examiner*—Ngan V. Ngo
*Attorney, Agent, or Firm*—David G. Conlin; Robert F. O'Connell; Kevin J. Fournier

[57] ABSTRACT

There is provided a solid state imaging device having high-sensitivity, low-noise characteristics by reducing electrostatic capacity relating to interconnection. The solid state imaging device includes a photoelectric conversion section, a transfer section, a floating diffusion layer for receiving signal charges from the transfer section, and an output transistor having a gate electrode connected to the floating diffusion layer via an interconnection. A source and a drain of the output transistor are provided commonly within a flat p-type well of relatively thin concentration in which the photoelectric conversion section, the transfer section, and the floating diffusion layer are also provided. It becomes possible to reduce an interconnection capacity, a gate-drain capacity, and a gate-channel capacity, to increase gain of a source follower circuit, to relax electric fields in the vicinity of the drain, and to prevent electric charges from inflow and outflow from substrate, without any increase in the fabrication process. As a result, a high-sensitivity, low-noise solid state imaging device can be offered.

4 Claims, 8 Drawing Sheets

Fig.3(d-2) Photoelectric conversion and vertical transfer section

Fig.3(d-1) First stage source follower driver transister

SOLID STATE IMAGING DEVICE HAVING HIGH-SENSITIVITY AND LOW-NOISE CHARACTERISTICS BY REDUCING ELECTROSTATIC CAPACITY OF INTERCONNECTION

BACKGROUND OF THE INVENTION

1. Field of the Invention

The present invention relates to a solid state imaging device. More particularly, the invention relates to enhancement in sensitivity of a solid state imaging device having a vertical overflow drain structure.

2. Description of the Prior Art

As the solid state imaging device, taking an example of an interline transfer type area image sensor, the prior art will be explained below.

Figure 5:
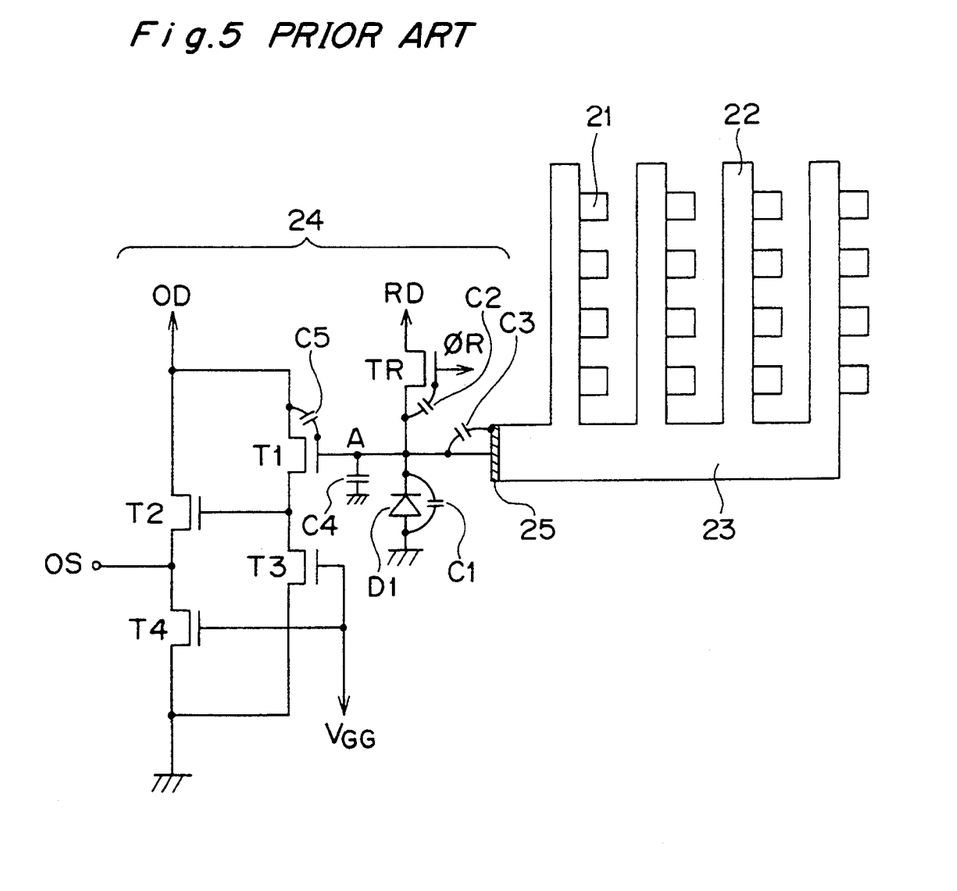
FIG. 5 is a view showing an overall construction of the above embodiment and the prior art solid state imaging device.

FIG. 5 shows the overall construction of a common interline transfer type area image sensor. Optical information incident on a matrix-arrayed photoelectric conversion section 21 is converted into a signal charge by the photoelectric conversion section 21. Then the signal charge is transferred to a charge detecting section 24 connected to a horizontal transfer section 23 via a vertical transfer section 22 and the horizontal transfer section 23. The charge detecting section 24 is comprised of a floating diffusion layer (forming a cathode side portion of a diode D1) for converting the signal charge in voltage, and a two-stage source follower circuit connected thereto for impedance conversion. This source follower circuit comprises transistors T1, T2 serving as its driver transistors, and transistors T3, T4 serving as its load transistors, where a DC voltage $V_{GG}$ is applied to gates of the transistors T3, T4. Also, DC voltage is applied to a RD terminal and an OD terminal. After the diode D1 is reset by a reset pulse $\phi R$ applied to a gate of a reset transistor TR, the signal charge transferred from the horizontal transfer section 23 is further transferred to the floating diffusion layer via an output gate 25. Depending on the amount of this signal charge, voltage at point A changes, and the resulting voltage change is converted in impedance by the two-stage source follower circuit, and outputted from an output terminal OS.

Referring to FIG. 5, when a ray of intense light impinges on part of the matrix-arrayed photoelectric conversion section 21, there will occur the so-called blooming phenomenon that excess charges generated stretch over the peripheral regions. To suppress this blooming phenomenon, a vertical overflow drain structure has been adopted heretofore.

Figure 8:
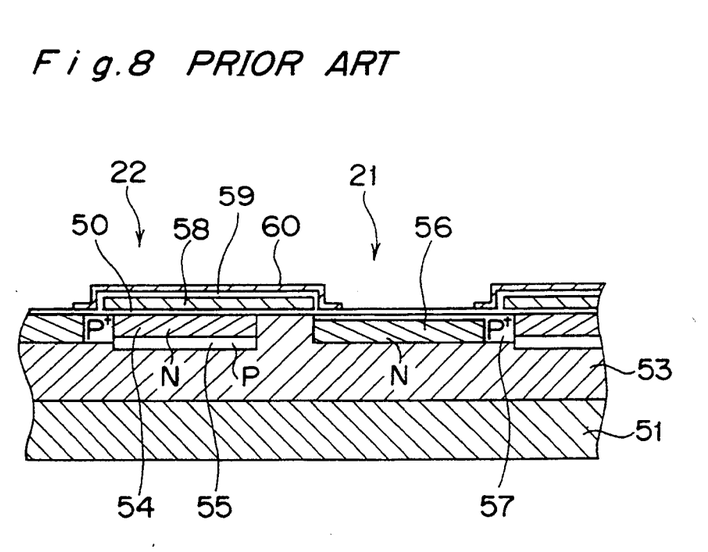
FIG. 8 is a view showing the structure in section of a photoelectric conversion section and a vertical transfer section of the prior art solid state imaging device.

FIG. 8 illustrates in section the vertical transfer section 22 and the photoelectric conversion section 21 having the vertical overflow drain structure. In detail, a FP (flat p-type) well 53 is formed on an n-type semiconductor substrate 51, and the vertical transfer section 22 and the photoelectric conversion section 21 are formed within the FP well 53. The vertical transfer section 22 comprises an n-type semiconductor layer 54, a p-type semiconductor layer 55 for preventing injection of charges and inflow of charges of smear components from the n-type semiconductor substrate 51 into the vertical transfer section 22, a vertical transfer electrode 58, and a light-screening film 60 for light screening. The photoelectric conversion section 21, on the other hand, comprises an n-type semiconductor layer 56, and a $p^+$-type semiconductor layer 57 for pixel isolation. It is noted that reference numerals 50 and 59 each denote a SiO$_2$ film, and that a Si$_3$N$_4$ film(not shown) is provided between the SiO$_2$ film 50 and the transfer electrode 58. The FP well 53 is set approximately to a concentration of dopants of $5 \times 10^{14}$ cm$^{-3}$ and a thickness of 3 $\mu$m, perfectly depleted due to the low concentration of dopants. Accordingly, excess charges generated in the photoelectric conversion section 21 will overflow beyond the barrier of the depleted FP well 53 toward the n-type semiconductor substrate 51 (vertical overflow drain structure). Meanwhile, between the n-type semiconductor layer 54 of the vertical transfer section 22 and the n-type substrate 51 is provided the p-type semiconductor layer 55, which is thicker in dopant level than the FP well 53, for preventing inflow and outflow of charges. Further, although not shown in FIG. 8, the aforementioned horizontal transfer section and the floating diffusion layer are, in general, also formed on the p-type semiconductor layer 55 within the FP well 53.

Figure 6:
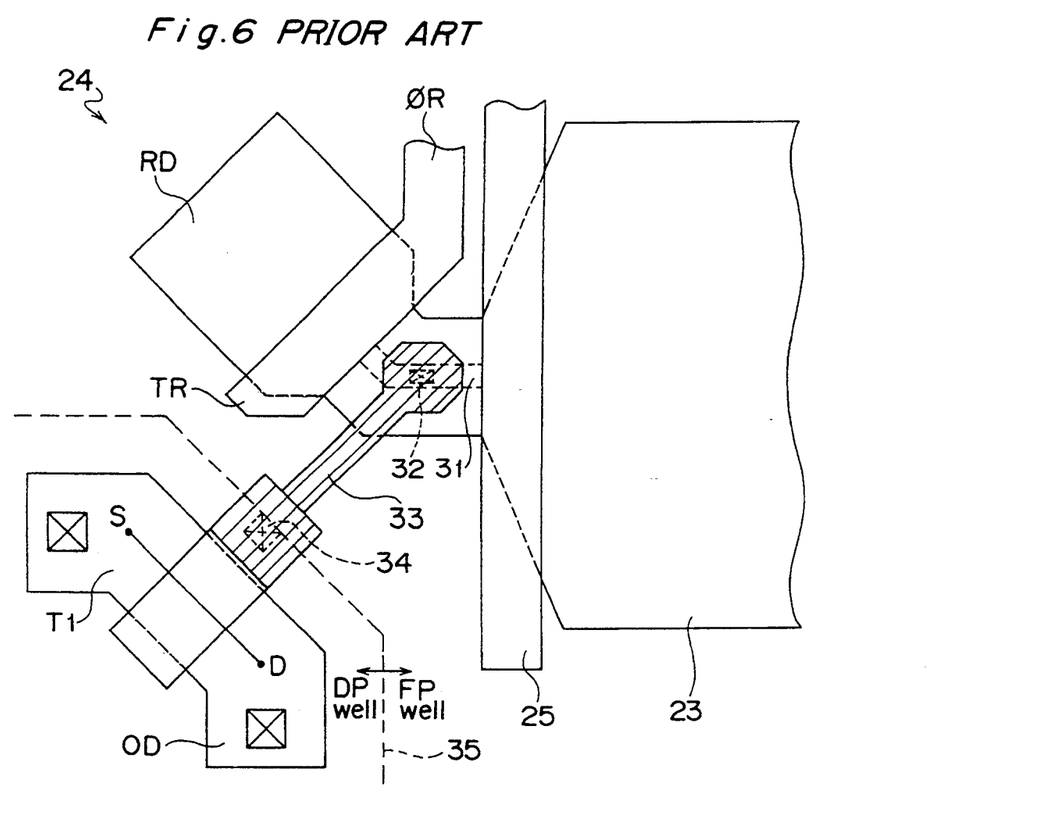
FIG. 6 is a plan view showing a charge detecting section of the prior art solid state imaging device in the vicinity of a floating diffusion layer.

FIG. 6 shows the planar layout of the charge detecting section 24 in the vicinity of a floating diffusion layer 31 in the vertical overflow drain structure. The floating diffusion layer 131 is connected to a metal wiring 33 at a contact 32, and the metal wiring 33 in turn is connected to a gate electrode of the first-stage source follower driver transistor T1 at a contact 34. Normally, the photoelectric conversion section (not shown in FIG. 6), the vertical transfer section (not shown in FIG. 6), the horizontal transfer section 23, an output gate 25, the floating diffusion layer 31, and the reset transistor TR are formed within the FP well 53 on the n-type semiconductor substrate 51 shown in FIG. 8. Meanwhile, as shown in FIG. 6, the first-stage source follower driver transistor T1 is formed within another deep p-type well more heavily doped and formed deeper than the FP well 53 (hereinafter, referred to as "DP well") for preventing charges from flowing into the source and drain regions from the n-type semiconductor substrate. As a result, the FP well and the DP well are adjoining to each other by the ends at a boundary 35.

Figure 7:
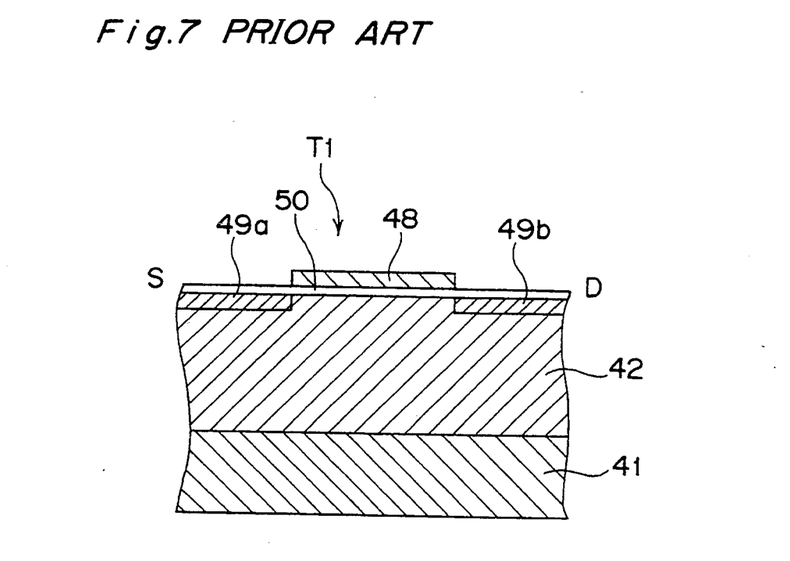
FIG. 7 is a view showing a structure in section of a first-stage source follower driver transistor of the prior art solid state imaging device.

FIG. 7 shows a section of the first-stage source follower driver transistor T1 (taken from a line S - D in FIG. 6). In the figure, a DP well 42 is formed on an n-type semiconductor substrate 41, the DP well 42 having a gate electrode 48, an n-type source 49a, and a drain 49b formed therein to make up the transistor T1. The source 49a and the drain 49b are formed in some self-alignment fashion with respect to the gate electrode 48. It is to be noted that a Si$_3$N$_4$ film(not shown) is provided between the SiO$_2$ film 50 and the gate electrode 48. Also, as disclosed in Japanese Patent Laid-Open Publication Hei 1-283870 (1989), a lightly doped region may be provided between the gate electrode 48 and the drain 49b to reduce the capacity between the gate electrode 48 and the drain 49b.

As one method for enhancing the sensitivity of the solid state imaging device, charge-to-voltage conversion efficiency of the charge detecting section 24 as shown in FIG. 5 may be elevated. If the amount of charges transferred to the floating diffusion layer (a cathode side portion of diode D1) is Q, total capacity relative to the floating diffusion layer is C, and gain of the source follower circuit is G, then the output voltage V can be represented as $V = G \cdot Q/C$. Also, the total capacity C contains, as capacity components, a junction capacity C1 between the floating diffusion layer and the well having the floating diffusion layer provided therein, a capacity C2 between the floating diffusion layer and the gate of the reset transistor TR adjoining thereto, a capacity C3 between the floating diffusion layer and the output gate 25 adjoining thereto, a capacity C4 had by an interconnection between the floating diffusion layer and the gate of the first-stage source follower driver transistor T1 (including capacity between interconnections, capacity between interconnections and semiconductor substrate, and capacity between gate and channel of the first-stage source follower driver transistor), and a capacity C5 between gate and drain of the first-stage source follower driver transistor. Accordingly, the total capacity C can be represented as C=C1+C2+C3+C4+C5, so that these capacities may be reduced to enhance the charge-to-voltage conversion efficiency.

Figure 9:
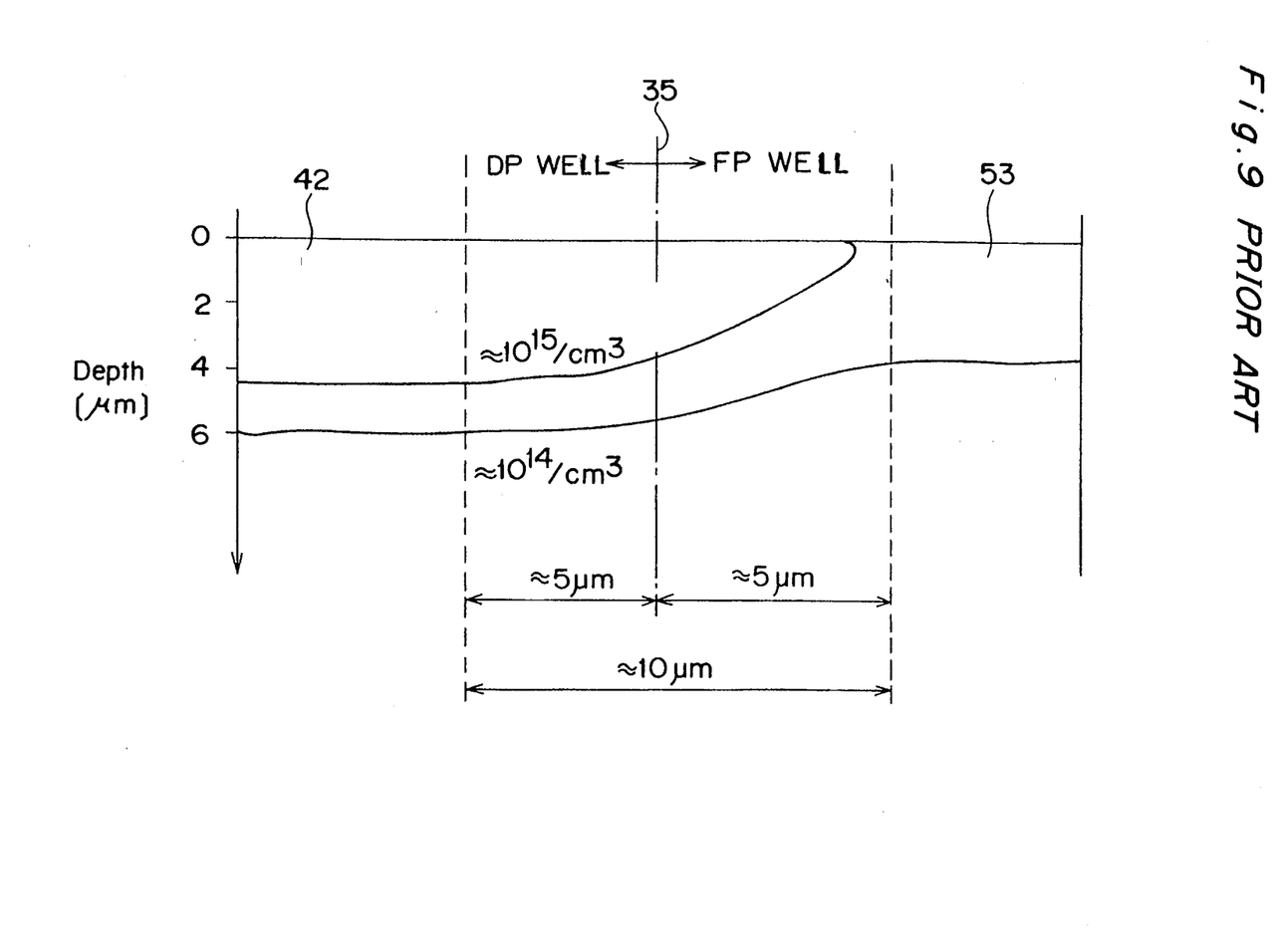
FIG. 9 is a chart showing a dopant profile at the boundary between FP well and DP well.

The above-described prior art structure would require such an arrangement that the floating diffusion layer 31 be separated sufficiently apart from the boundary 35 between FP and DP wells and besides that the first-stage source follower driver transistor T1 be separated sufficiently apart from the boundary 35 between FP and DP wells. More specifically, since the two kinds of wells would diffuse through heat treatment, after ion implantation, to stretch laterally, the DP well would affect the characteristics of the reset transistor TR, the horizontal transfer section 23, the output gate 25, and the floating diffusion layer 31, while the FP well would affect the characteristics of the first-stage source follower driver transistor T1. Due to this, the boundary 35 between the DP well and the FP well needs to be separated sufficiently apart from both the floating diffusion layer 31 and the first-stage source follower driver transistor T1. Of course, the boundary 35 needs to be separated also from the reset transistor TR, the horizontal transfer section 23, and the output gate 25, but these do not matter in terms of layout. In fact, as shown in FIG. 9, at the boundary 35 between the FP well and the DP well, a dopant profile varies laterally over a width of about 10 $\mu$m. Therefore, in order to make the concentration of dopants constant within each of the FP well 53 and the DP well 42, and to thereby obtain stable characteristics, the distance between the floating diffusion layer 31 and the first-stage source follower driver transistor T1 as shown in FIG. 6 needs to be at least 10 $\mu$m or so. As a result of this, in the conventional structure, the interconnection 33 that connects the floating diffusion layer 31 and the gate of the first-stage source follower driver transistor T1 would be lengthened, so that an interconnection capacity C4 (more precisely, a capacity between interconnections and a capacity between the interconnection and semiconductor substrate, out of the C4) would result in a large one. For this reason, the charge-to-voltage conversion efficiency of the charge detecting section 24 would lower, causing its sensitivity to also lower, disadvantageously.

Also, there has been another problem that the capacity C5 between gate and drain of the first-stage source follower driver transistor T1 is too large.

Further, due to conduction by punch-through between source and drain of the first-stage source follower driver transistor T1, gate length of the transistor could not be shortened, so that the capacity between gate and channel of the first-stage source follower driver transistor T1 out of the interconnection capacity C4 could not be reduced, as a further problem.

Furthermore, due to concentration of electric fields in the vicinity of the drain of the first-stage source follower driver transistor T1, there would be generated electron and hole pairs by the impact ionization phenomenon, which would cause great noise.

SUMMARY OF THE INVENTION

The object of the present invention is therefore to provide a solid state imaging device which solves the above problems of the prior art without involving any complex processes of fabrication and yet which exhibits high-sensitivity and low-noise characteristics.

In order to achieve the aforementioned object, there is provided a solid state imaging device comprising: a semiconductor substrate of a first conductive type; a well of a second conductive type provided on the semiconductor substrate, the second conductive type of the well being the conductive type reverse to the first conductive type of the semiconductor substrate; a photoelectric conversion section having a first semiconductor layer of the first conductive type provided within the well and serving for converting incident light into signal charges at a junction plane between the first semiconductor layer and the well; a transfer section having a second semiconductor layer of the first conductive type provided within the well and a third semiconductor layer of the second conductive type provided under the second semiconductor layer and thicker in concentration of dopants than the well, and serving for transferring signal charges received from the photoelectric conversion section through the second semiconductor layer; a floating diffusion layer being comprised of a fourth semiconductor layer of the first conductive type provided within the well and serving for receiving the signal charges outputted by the transfer section; and an output transistor having a gate electrode connected to the floating diffusion layer via an interconnection and serving for outputting a signal corresponding to a potential of the floating diffusion layer, wherein channel, source, and drain regions of the output transistor are provided within the well.

In the solid state imaging device, the channel, source, and drain regions of the output transistor are provided within the same well as the floating diffusion layer is provided within. Therefore, the output transistor and the floating diffusion layer may be made closest to each other as far as the design rules permit or as fine machining permits. In such a case, length of the interconnection that connects the floating diffusion layer and the gate electrode of the output transistor is shortened so that capacity had by the interconnection (more precisely, a capacity between interconnections and a capacity between an interconnection and the semiconductor substrate) can be reduced. Accordingly, the solid state imaging device is improved in sensitivity, compared with the prior art. Further, the output transistor (generally, forming a source follower circuit) is improved in gain by being provided within a thinly doped well.

Also, in an embodiment of the present invention, under the source and drain regions of the output transistor there is provided a fifth semiconductor layer of the second conductive type which is thicker in concentration of dopants than the well.

In the case of the solid state imaging device of the above embodiment, since the fifth semiconductor layer of the second conductive type which is thicker in concentration of dopants than the well is provided under the source and drain regions of the output transistor, charges are prevented from injection from the semiconductor substrate into the source and drain regions and from outflow from the source region to the semiconductor substrate. As a result, a vertical overflow drain structure is formed by the output transistor within the well. Besides, since the conduction by punch through between source and drain is suppressed by the fifth semiconductor layer, gate length of the output transistor can be shortened. As a result, out of the capacities had by the interconnection that connects the floating diffusion layer and the gate electrode of the output transistor, the capacity between the gate electrode and channel can be reduced. Accordingly, the solid state imaging device can be further improved in sensitivity.

Further, in a solid state imaging device of another embodiment, the fifth semiconductor layer and the third semiconductor layer are the same layer.

In the solid state imaging device of the embodiment, since the fifth semiconductor layer and the third semiconductor layer are of the same layer, they are formed at the same time. Accordingly, there will be involved no complex processes for fabrication of the solid state imaging device.

In a solid state imaging device of an embodiment, the source and drain regions of the output transistor are comprised of a sixth semiconductor layer of the first conductive type, and a seventh semiconductor layer of the first conductive type which is provided under the sixth semiconductor layer and on a gate side and is thinner in concentration of dopants than the sixth semiconductor layer.

In the solid state imaging device of the embodiment, a capacity between the gate electrode and drain of the output transistor is reduced by virtue of the thinly doped seventh semiconductor layer. Accordingly, the solid state imaging device can be further improved in sensitivity. Further, concentration of electric fields in the vicinity of the drain can be relaxed by the seventh semiconductor layer, whereby electron and hole pairs can be prevented from occurring due to an impact ionization phenomenon. As a result, noise of the solid state imaging device can be reduced.

In a solid state imaging device of an embodiment, the second semiconductor layer and the seventh semiconductor layer are the same layer.

In the solid state imaging device of claim 5, since the second semiconductor layer and the seventh semiconductor layer are of the same layer, they are formed at the same time. Accordingly, there will be involved no complex processes for fabrication of the solid state imaging device.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 3(a-1), 3(a-2), 3(b-1), 3(b-2), 3(c-1), 3(c-2), 3(d-1), 3(d-2), 3(e-1), 3(e-2) are views showing a fabrication process of the solid state imaging device;

DETAILED DESCRIPTION OF THE PREFERRED EMBODIMENTS

The solid state imaging device of the present invention is described hereinbelow in more detail with reference to an embodiment thereof.

The following description is made by way of example in the case of an interline transfer type area image sensor having an equivalent circuit identical to the equivalent circuit shown in FIG. 5.

Figure 1A:
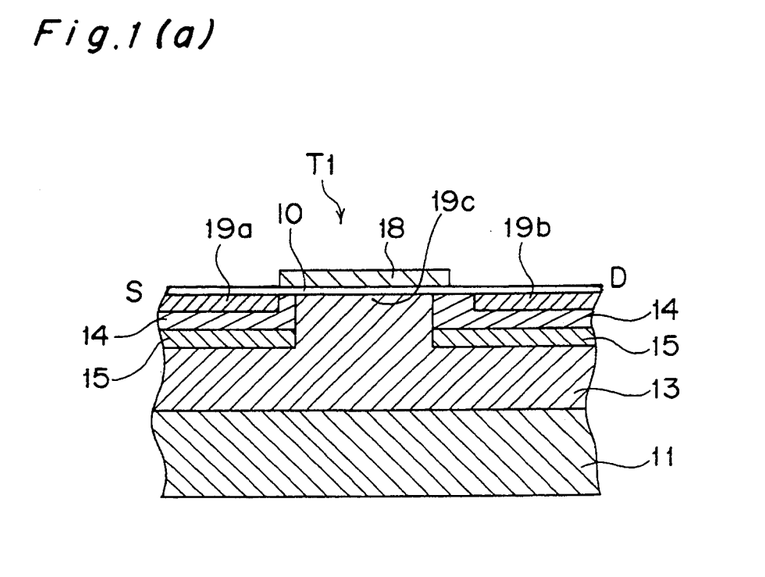
FIG. 1(a) is a view showing a structure in section of a first-stage source follower driver transistor of a solid state imaging device according to an embodiment of the present invention.
Figure 1B:
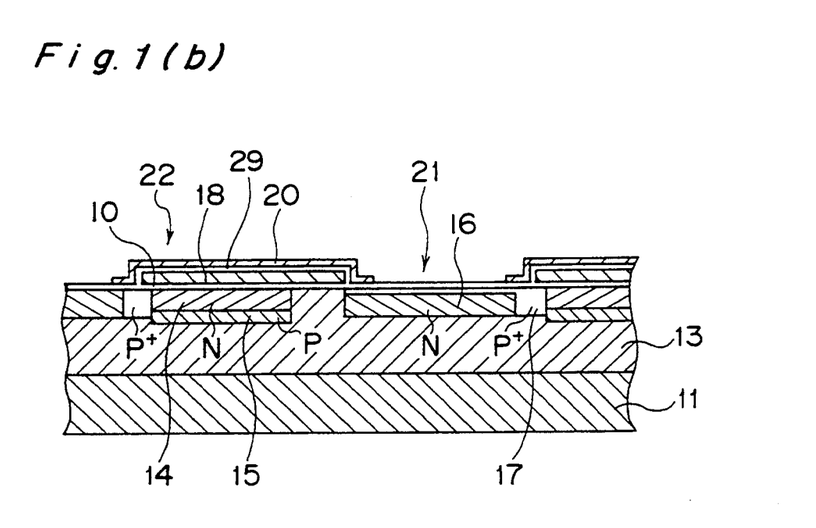
FIG. 1(b) is a view showing a structure in section of a photoelectric conversion section, and a vertical transfer section of the solid state imaging device.
Figure 1C:
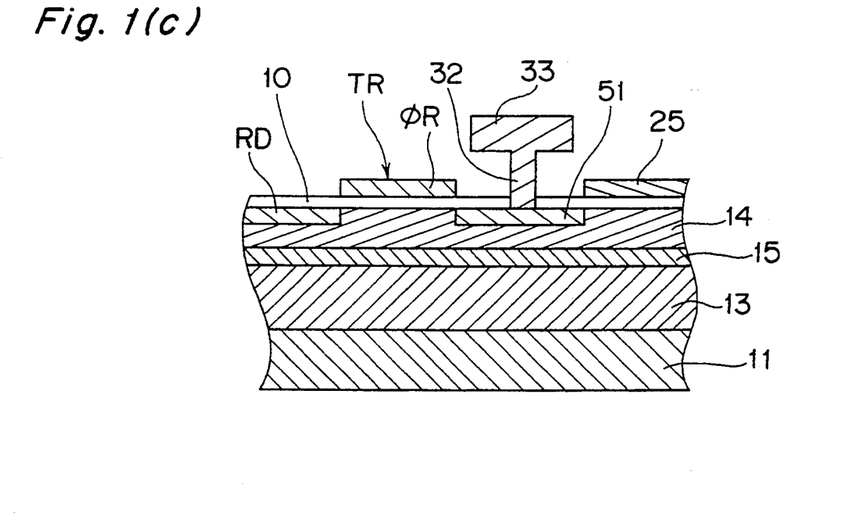
FIG. 1(c) is a sectional view of a charge detecting section of the solid state imaging device.

FIG. 1(a) shows a section of a first-stage source follower driver transistor T1 in a solid state imaging device of one embodiment of the invention, FIG. 1 (b) shows a section of a photoelectric conversion section 21 and a vertical transfer section 22 of the solid state imaging device, and FIG. 1(c) shows a section of part of a charge detection section. In the figures, there are shown an n-type semiconductor substrate 11, a FP(flat p-type) well 13, an n-type semiconductor layer 14, a p-type semiconductor layer 15, an n-type semiconductor layer 16, which constitutes part of the photoelectric conversion section 21, a $p^+$-type semiconductor layer 17 for pixel isolation, an electrode 18, a source 19a being a heavily doped n-type semiconductor layer, a drain 19b being a heavily doped n-type semiconductor layer, a channel 9c, and a light-screening film 20. In this arrangement, the p-type semiconductor layer 15 is thicker in concentration of dopants than the FP well 13; the p-type semiconductor layer 15 is thinner in concentration of dopants than the n-type semiconductor layer 14; and the drain 19b is thicker in concentration of dopants than the n-type semiconductor layer 14. Further, $SiO_2$ films are designated by numerals 10 and 29, and a $Si_3N_4$ film(not shown) is provided between the $SiO_2$ film 10 and each electrode 18.

Figure 2:
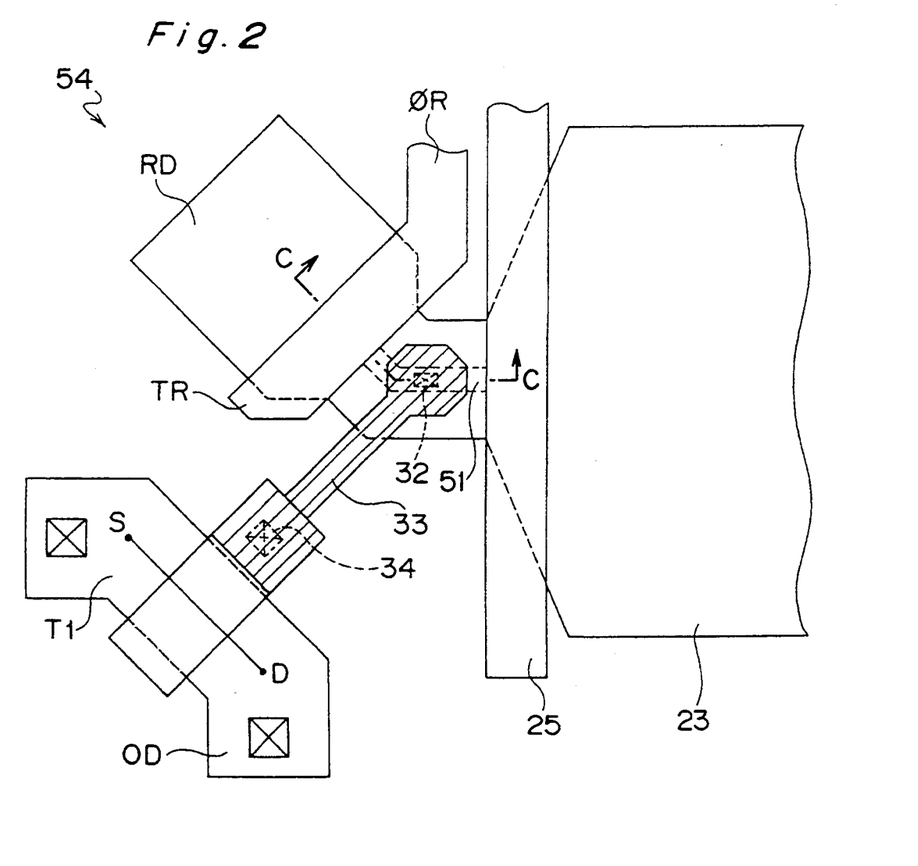
FIG. 2 is a plan view showing the charge detecting section of the solid state imaging device.

In this solid state imaging device, the relatively thinly doped FP well 13 as shown in FIGS. 1(a), 1(b) and 1(c) is provided with the first-stage source follower driver transistor T1, a floating diffusion layer 51 (cathode side portion of diode D1 in FIG. 5), the photoelectric conversion section 21, and the vertical transfer section 22, all of which are shown in FIGS. 2 and 5. FIG. 2 in a plan view showing the charge detection section 54, and FIG. 1(c) is a sectional view taken a dot-dash line C—C in FIG. 2. This arrangement that the first-stage source follower driver transistor T1 and the floating diffusion layer 51 and others are provided within the common well 13 allows the first-stage source follower driver transistor T1 to be made closest to a reset transistor TR, an output gate 25, and the floating diffusion layer 51 as far as the design rules permit or as fine machining permits. As a result of this, an interconnection capacity C4 between the floating diffusion layer and the gate of the first-stage source follower driver transistor T1 connected thereto (more precisely, a capacity between interconnections and a capacity between an interconnection and the semiconductor substrate) can be reduced. Accordingly, the solid state imaging device can be improved in sensitivity, compared with the prior art.

Further, the n-type semiconductor layer 14 of the vertical transfer section 22 as shown in FIG. 1(b) serves as the transfer section, while the p-type semiconductor layer 15 of the vertical transfer section 22 serves to prevent injection of charges and inflow of smear component charges from the n-type semiconductor substrate 11 into the n-type semiconductor layer 14. Also, the n-type semiconductor layer 14 of the first-stage source follower driver transistor T1 as shown in FIG. 1(a) reduces a capacity C5 between gate and drain of the transistor T1. Accordingly, the solid state imaging device can be further improved in sensitivity. The n-type semiconductor layer 14 further serves to relax concentration of electric fields in the vicinity of the drain, to prevent occurrence of electron and hole pairs due to an impact ionization phenomenon, and to reduce noise. The p-type semiconductor layer 15 of the first-stage source follower driver transistor T1 prevents injection of charges from the n-type semiconductor substrate 11 into the source 19a and the drain 19b or overflow of charges from the source 19a to the n-type semiconductor substrate 11. As a result, the first-stage source follower driver transistor T1 can be formed within the FP well 13 of such a low concentration of dopants as to allow formation of a vertical overflow drain. Besides the p-type semiconductor layer 15 serves to suppress conduction by punch through between source and drain, allowing the gate length of the transistor T1 to be shortened. As a result of this, the capacity between gate and channel out of the interconnection capacity C4 can be reduced. Accordingly, the solid state imaging device can be further improved in sensitivity.

Figure 3:
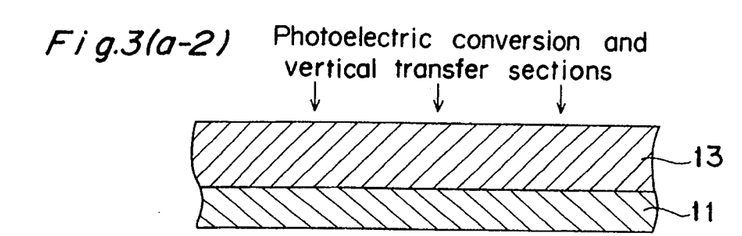
Figure 4:
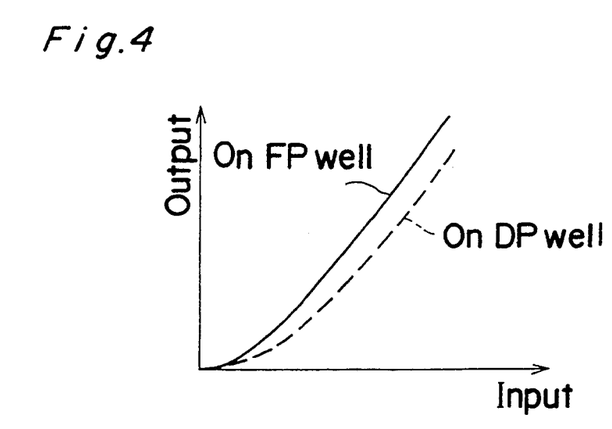
FIG. 4 is a chart showing input and output characteristics of a source follower circuit.

As understood from FIG. 2, the charge detection section 54 of this solid state imaging device has the same elements as those in FIG. 6. Therefore, the same elements are shown by the same reference numerals as those in FIG. 6, and description thereof is omitted The solid state imaging device is fabricated in the following manner. First, as shown in FIGS. 3 (a-1) and 3 (a-2), a FP well (concentration of dopants: $5 \times 10^{14}$ cm$^{-3}$; thickness: approx. 3 $\mu$m) 13 is formed on the n-type semiconductor substrate 11 by a p-type ion implantation process and a diffusion process.

Next, as shown in FIGS. 3 (b-1) and 3 (b-2), with resist R applied to a surface, photolithography process is performed for patterning to form the source and drain regions of the first-stage source follower driver transistor T1 and the vertical transfer section 22. Subsequently, the n-type semiconductor layer 14 and the p-type semiconductor layer 15 are formed by simultaneously implanting ions both in the source and drain regions of the first-stage source follower driver transistor T1 and in the vertical transfer section 22. Thus, the p-type semiconductor layer 15 is formed at one time for both the first-stage source follower driver transistor T1 and the vertical transfer section 22, while the n-type semiconductor layer 14 is formed at one time for both the first-stage source follower driver transistor T1 and the vertical transfer section 22. In this process, the n-type semiconductor layer 14 is arranged to have a surface density of $2 \times 10^{17}$ cm$^{-3}$ and a junction depth of 0.4 $\mu$m while the p-type semiconductor layer 15 is arranged to have a peak concentration of $3 \times 10^{16}$ cm$^{-3}$ and a peak depth of 0.9 $\mu$m. Since the n-type semiconductor layer 14 and the p-type semiconductor layer 15 are respectively formed by implanting ions at the same time both in the source and drain regions of the first-stage source follower driver transistor T1 and in the vertical transfer section 22, there will be involved no complex processes in fabrication.

Then, as shown in FIGS. 3 (c-1) and 3 (c-2), gate oxidation is carried out to form a SiO$_2$ film 10 and a Si$_3$N$_4$ film(not shown), which is followed by patterning and ion implantation by which a p$^+$-type semiconductor layer 17 for pixel isolation is formed. Also, polysilicon as the material for the gate electrode is deposited by a CVD process or the like. Then this is followed by patterning, where the polysilicon and the Si$_3$N$_4$ film are etched in succession. By this process, a transfer electrode 18 of the vertical transfer section 22 and the horizontal transfer section (not shown) and a gate electrode 18 of the first-stage source follower driver transistor are formed. It is noted that the gate electrodes 18 are connected to the floating diffusion layer in a later process.

Then, as shown in FIG. 3 (d-2), the n-type semiconductor layer 16 is formed in the photoelectric conversion section 21 by patterning and ion implantation. Thereafter, as shown in FIGS. 3 (d-1) and 3 (d-2), the source 19a and drain 19b, which are each a heavily doped n-type semiconductor layer, are formed by application of resist R', patterning, and ion implantation. In this example, the drain 19b is formed so as to be spaced from the gate electrode 18 by 0.4 $\mu$m. As a result of this, the capacity C5 between gate and drain can be further reduced, compared with the case where both the source 19a and the drain 19b are formed in some self alignment fashion with respect to the gate electrode 18.

Next, as shown in FIGS. 3 (e-1) and 3 (e-2), the p-type semiconductor layer 17' is formed on the surface of the n-type semiconductor layer 16 in self alignment with respect to the gate electrode 18 for the purpose of reducing dark current of the photoelectric conversion section 21.

Thereafter, the light-screening film 20 is provided to the vertical transfer section 22 by a known method, thus completing the fabrication of the solid state imaging device with high sensitivity and low noise.

In fact, the capacity C4 (including the interconnection capacity, the capacity between the interconnection and semiconductor substrate, and capacity between gate and channel of the first-stage source follower driver transistor T1) and the capacity C5 was reduced in their sum total by 35%. In proportion to this, the solid state imaging device was improved in sensitivity.

In this embodiment, the first-stage source follower driver transistor T1, the photoelectric conversion section 21, the vertical transfer section 22, the horizontal transfer section 23, and the floating diffusion layer all have been formed on the FP well. However, all of these may conversely be formed on the DP well as was stated in the prior art. Nevertheless, since the FP well is generally lower in concentration than the DP well, a back gate effect is suppressed in the case of formation on the FP well, compared with that on the DP well, which contributes to increase in the gain of the source follower circuit. Accordingly, the present embodiment arrangement is preferred.

It is to be noted that the present invention may be changed and modified in various ways within the scope of the appended claims, thus not limited to the above embodiment.

As apparent from the above description, the solid state imaging device of the present invention comprises a semiconductor substrate of a first conductive type; a well of a second conductive type provided on the semiconductor substrate, the second conductive type of the well being the conductive type reverse to the first conductive type of the semiconductor substrate; a photoelectric conversion section having a first semiconductor layer of the first conductive type provided within the well and serving for converting incident light into signal charges at a junction plane between the first semiconductor layer and the well; a transfer section having a second semiconductor layer of the first conductive type provided within the well and a third semiconductor layer of the second conductive type provided under the second semiconductor layer and thicker in concentration of dopants than the well, and serving for transferring signal charges received from the photoelectric conversion section through the second semiconductor layer; a floating diffusion layer being comprised of a fourth semiconductor layer of the first conductive type provided within the well and serving for receiving the signal charges outputted by the transfer section; and an output transistor having a gate electrode connected to the floating diffusion layer via an interconnection and serving for outputting a signal corresponding to a potential of the floating diffusion layer, wherein channel, source, and drain regions of the output transistor are provided within the well. Therefore, the output transistor and the floating diffusion layer may be made closest to each other as far as the design rules permit or as fine machining permits. Accordingly, length of the interconnection that connects the floating diffusion layer and the gate electrode of the output transistor can be shortened so that capacity had by the interconnection (more precisely, a capacity between interconnections, and a capacity between interconnection and the semiconductor substrate) can be reduced. Accordingly, the solid state imaging device can be improved in sensitivity, compared with the prior art. Further, the output transistor (generally, forming a source follower circuit) can be improved in gain by being provided within a thinly doped well.

Also, the solid state imaging device of an embodiment is provided with a fifth semiconductor layer of the second conductive type which is thicker in concentration of dopants than the well, under the source and drain regions of the output transistor. Therefore, charges can be prevented from injection from the semiconductor substrate into the source and drain regions or from overflow from the source region to the semiconductor substrate, allowing a vertical overflow drain structure to be formed by the output transistor within the well. Moreover, conduction by punch through between source and drain is suppressed by the fifth semiconductor layer, so that gate length of the output transistor can be shortened. As a result, out of the capacities had by the interconnection that connects the floating diffusion layer and the gate electrode of the output transistor, the capacity between the gate electrode and channel can be reduced. Accordingly, the solid state imaging device can be further improved in sensitivity.

Further, the solid state imaging device of an embodiment is so arranged that the fifth semiconductor layer and the third semiconductor layer are the same layer, and therefore formed at the same time. Accordingly, the process of fabricating the solid state imaging device can be prevented from being complicated.

Further, the solid state imaging device of an embodiment is so arranged that the source and drain regions of the output transistor are comprised of a sixth semiconductor layer of the first conductive type, and a seventh semiconductor layer of the first conductive type which is provided under the sixth semiconductor layer and on the gate side and is thinner in concentration of dopants than the sixth semiconductor layer. In such a case, a capacity between the gate electrode and drain of the output transistor can be reduced by virtue of the thinly doped seventh semiconductor layer. Accordingly, the solid state imaging device can be further improved in sensitivity. Further, concentration of electric fields in the vicinity of the drain can be relaxed by the seventh semiconductor layer, whereby electron and hole pairs can be prevented from occurring due to the impact ionization phenomenon. As a result, the noise of the solid state imaging device can be reduced.

Yet further, the solid state imaging device of an embodiment is so arranged that the second semiconductor layer and the seventh semiconductor layer are of the same layer. Therefore, the layers are formed at the same time. Accordingly, the process of fabricating the solid state imaging device can be prevented from being complicated.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A solid state imaging device comprising:
   a semiconductor substrate of a first conductive type;
   a well of a second conductive type provided on the semiconductor substrate, the second conductive type of the well being the conductive type reverse to the first conductive type of the semiconductor substrate;
   a photoelectric conversion section having a first semiconductor layer of the first conductive type provided within the well and serving for converting incident light into signal charges at a junction plane between the first semiconductor layer and the well;
   a transfer section having a second semiconductor layer of the first conductive type provided within the well and a third semiconductor layer of the second conductive type provided under the second semiconductor layer and thicker in concentration of dopants than the well, and serving for transferring signal charges received from the photoelectric conversion section through the second semiconductor layer;
   a floating diffusion layer being comprised of a fourth semiconductor layer of the first conductive type provided within the well and serving for receiving the signal charges outputted by the transfer section; and a driver transistor having a gate electrode connected to the floating diffusion layer via an interconnection and serving for outputting a signal corresponding to a potential of the floating diffusion layer, wherein channel, source, and drain regions of the driver transistor are provided within the well, and wherein under the source and drain regions of the driver transistor there is further provided a fifth semiconductor layer of the second conductive type which is thicker in concentration of dopants than the well.

2. A solid state imaging device as claimed in claim 1, wherein the fifth semiconductor layer and the third semiconductor layer are the same layer.

3. A solid state imaging device comprising:

a semiconductor substrate of a first conductive type;

a well of a second conductive type provided on the semiconductor substrate, the second conductive type of the well being the conductive type reverse to the first conductive type of the semiconductor substrate;

a photoelectric conversion section having a first semiconductor layer of the first conductive type provided within the well and serving for converting incident light into signal charges at a junction plane between the first semiconductor layer and the well;

a transfer section having a second semiconductor layer of the first conductive type provided within the well and a third semiconductor layer of the second conductive type provided under the second semiconductor layer and thicker in concentration of dopants than the well, and serving for transferring signal charges received from the photoelectric conversion section through the second semiconductor layer;

a floating diffusion layer being comprised of a fourth semiconductor layer of the first conductive type provided within the well and serving for receiving the signal charges outputted by the transfer section; and a driver transistor having a gate electrode connected to the floating diffusion layer via an interconnection and serving for outputting a signal corresponding to a potential of the floating diffusion layer, wherein channel, source, and drain regions of the driver transistor are provided within the well, and wherein the source and drain regions of the driver transistor are comprised of a fifth semiconductor layer of the first conductive type, and a sixth semiconductor layer of the first conductive type which is provided under the fifth semiconductor layer and between the channel region and the fifth semiconductor layer and is thinner in concentration of dopants than the fifth semiconductor layer.

4. A solid state imaging device as claimed in claim 3, wherein the second semiconductor layer and the sixth semiconductor layer are the same layer.

* * * * *